US008867135B2

(12) United States Patent
Kanga

(10) Patent No.: US 8,867,135 B2
(45) Date of Patent: Oct. 21, 2014

(54) NON-ATTENUATING LIGHT COLLIMATING ARTICLES FOR GRAPHIC ARTS

(71) Applicant: Xiper Innovations, Inc., Marietta, GA (US)

(72) Inventor: Rustom Sam Kanga, Marietta, GA (US)

(73) Assignee: Xiper Innovations, Inc., Marietta, GA (US)

( * ) Notice: Subject to any disclaimer, the term of this patent is extended or adjusted under 35 U.S.C. 154(b) by 0 days.

(21) Appl. No.: 13/855,903

(22) Filed: Apr. 3, 2013

(65) Prior Publication Data

US 2013/0222917 A1   Aug. 29, 2013

Related U.S. Application Data

(62) Division of application No. 11/939,791, filed on Nov. 14, 2007, now Pat. No. 8,441,730.

(60) Provisional application No. 60/858,969, filed on Nov. 14, 2006.

(51) Int. Cl.
| *G02B 27/10* | (2006.01) |
| *G03F 7/26* | (2006.01) |
| *G03F 7/20* | (2006.01) |
| *G02B 3/08* | (2006.01) |
| *G02B 3/00* | (2006.01) |
| *G02B 27/30* | (2006.01) |

(52) U.S. Cl.
CPC ............ *G02B 3/0006* (2013.01); *G03F 7/2008* (2013.01); *G02B 3/08* (2013.01); *G02B 27/30* (2013.01); *G03F 7/2014* (2013.01)
USPC .......................................... 359/619; 430/306

(58) Field of Classification Search
USPC ................... 359/619, 641, 741, 742; 430/306
See application file for complete search history.

(56) References Cited

U.S. PATENT DOCUMENTS

| 3,712,727 A | 1/1973 | Bonnet |
| 4,608,622 A | 8/1986 | Gonser |
| 5,147,761 A | 9/1992 | Wessells et al. |
| 5,822,038 A | 10/1998 | Slater et al. |
| 5,844,720 A | 12/1998 | Ohara et al. |
| 6,111,696 A | 8/2000 | Allen et al. |
| 6,245,487 B1 | 6/2001 | Randall |
| 6,398,370 B1 | 6/2002 | Chiu et al. |
| 6,766,740 B1 | 7/2004 | Wier |
| 6,880,946 B2 | 4/2005 | Mullen |
| 6,905,219 B2 | 6/2005 | Gaides |
| 6,953,623 B2 | 10/2005 | Olson et al. |
| 7,251,079 B2 | 7/2007 | Capaldo et al. |

(Continued)

FOREIGN PATENT DOCUMENTS

WO   2004038458 A2   5/2004

OTHER PUBLICATIONS

Barnaby J. Feder, entitled "Where Repetition is Exciting", New York Times, Nov. 8, 1995, 4 pages.

(Continued)

*Primary Examiner* — William Choi
(74) *Attorney, Agent, or Firm* — Thomas | Horstemeyer, LLP.

(57) ABSTRACT

Various systems and methods are provided for non-attenuating light collimating articles. In one embodiment, among others, a phototool comprises a substrate; and a microstructured surface disposed on a first surface of the substrate, the microstructured surface comprising a plurality of light collimating articles.

21 Claims, 10 Drawing Sheets

(56) References Cited

U.S. PATENT DOCUMENTS

| | | |
|---|---|---|
| 2002/0097496 A1 | 7/2002 | Lu |
| 2006/0066945 A1 | 3/2006 | Yeo et al. |
| 2006/0164729 A1 | 7/2006 | Wood |
| 2007/0183054 A1 | 8/2007 | Ryzhikov et al. |

OTHER PUBLICATIONS

Vikuiti (TM) Brightness Enchancement Film III: http://solutions.3m.com/wps/portal/3M/en.sub.—US/Vikuiti1/BrandProducts/-main/, 1 page, (Nov. 2007).

All Vikuiti (TM) Films: http://solutions.3m.com/wps/portal/3M/en.sub.—US/Vikuiti1/BrandProducts/-main/productliterature/allvikuitiproducts/, 5 pages, (Nov. 2007).

Vikuiti (TM) Light Control Film (LCF): http://solutions.3m.com/wps/portal/3M/en.sub.—US/Vikuiti1/BrandProducts/-main/productliterature/productionformation/?PC.sub.—7.sub.—RJH9U5230GE3E-02LECFTDQ8KB7.sub.—nid=RHGFSQGLQJbeZF5G3RNK7Bgl, 1 page, (Nov. 2007).

Kneipp, K.G.; entitled "Use of prismatic films to control light distribution", International Lighting in Controlled Environments Workshop, T.W. Tibbitts (editor) 1994 NASA-CP-95/3309, 10 pages, (Dec. 2007).

Davis, Donald J.; entitled Getting Big by Going Small with Nano and Microstructured Polymers, Avery Dennison Microreplication, Painesville, OH, Poster paper presented at Liquid Crystal Day, Liquid Crystal Institute, Kent State University, Apr. 23, 2004, 13 pages.

Microreplication at Avery Dennison: http://www.averydennison.com/corporate. nsf/50e86d296559306188256a3b00693bd7/1db808ad7cca252c882572b8007cfb6c?Ope- n Document, (Oct. 2006).

Arthur Davis, Robert C. Bush, John C. Harvey and Michael F. Foly, PhD, Fresnel Lenses in Rear Projection Displays, Fresnel Optics, Rochester, NY, USA., www.Reflexite.com; http://www.display-optics.com/pdf/tech.sub.—papers.sub.—june2001.pdf, 5 pages.

Optical Microstructured Surfaces: Reflexite Display Optics, www.Reflexite.com, http://display-optics.com/pdf/Optical-Microstructured-Surfaces.pdf, 2 pages, (Dec. 2006).

Foley, Michael, entitled Technical Advances in Microstructured Plastic Optics for Display Applications, Fresnel Optics, Rochester, NY and Apolda, Germany, www.Reflexite.com; http://www.display-optics.com/pdf/tech.sub.—papers.sub.—may1999.pdf, 4 pages.

Scott, Steve, entitled "Large Area Microstructured Optic Applications", Reflexite Precision Technology Center, West Henrietta, NY, 14586 USA, www.Reflexite.com, http://www.display-optics.com/pdf/ LargeAreaMicrostructuredOpticApplicatio- ns.pdf, 3 pages, (Mar. 2006).

Microstructure Based Optical Films: http://www.brightviewtechnologies.com, 1 page, (Nov. 2007).

Fresnel Cylindrical Lens

NON-ATTENUATING LIGHT COLLIMATING ARTICLES FOR GRAPHIC ARTS

CROSS REFERENCE TO RELATED APPLICATIONS

This application is a divisional of U.S. patent application Ser. No. 11/939,791, entitled "NON-ATTENUATING LIGHT COLLIMATING ARTICLES FOR GRAPHIC ARTS" and filed Nov. 14, 2007, which makes reference to, and claims priority to and the benefit of U.S. provisional application entitled "NON-ATTENUATING LIGHT COLLIMATING ARTICLES FOR GRAPHIC ARTS" having Ser. No. 60/858,969, filed Nov. 14, 2006, both of which are entirely incorporated herein by reference.

BACKGROUND

In the manufacture of relief printing plates from photocurable materials, a layer of material undergoes a curing reaction upon exposure to actinic radiation. The actinic radiation passes through a photographic negative and then through the photocurable material to selectively cure the material in a pattern corresponding to the image borne by the negative. However, there can be a loss of integrity of the image due to side effects created by actinic light reflection, refraction, and actinic light coming in at a shallow angle. Light collimation of actinic radiation is desirable to obtain high resolution or definition of printing elements or plates.

SUMMARY

Embodiments of the present disclosure include structures and methods related to non-attenuating light collimating articles.

Briefly described, one embodiment, among others, comprises a phototool comprising a substrate; and a microstructured surface disposed on a first surface of the substrate, the microstructured surface comprising a plurality of light collimating articles.

Another embodiment, among others, comprises a combination for producing relief images, comprising a source of actinic radiation; a phototool positioned to receive actinic radiation from the source at a first side of the phototool, the phototool comprising a microstructured surface, the microstructured surface comprising a plurality of light collimating articles; and a printing plate disposed adjacent to a second side of the phototool.

Another embodiment, among others, comprises a structure comprising a printing plate; and a microstructured surface disposed on a first surface of the printing plate, the microstructured surface comprising a plurality of light collimating articles.

Another embodiment, among others, comprises a structure comprising a coversheet; a microstructured surface disposed on a first surface of the coversheet, the microstructured surface comprising a plurality of light collimating articles; and a phototool substrate disposed adjacent to a second surface of the coversheet.

Another embodiment, among others, comprises a structure comprising a creen; a microstructured surface disposed on a surface of the creen, the microstructured surface comprising a plurality of light collimating articles; and a phototool substrate having a first surface, the first surface disposed adjacent to the microstructured surface.

Another embodiment, among others, comprises a combination for producing relief images, comprising a source of actinic radiation; a light collimating article positioned adjacent to the source, the light collimating article positioned to collimate the actinic radiation from the source; a phototool positioned to receive collimated actinic radiation from the source at a first side of the phototool; and a printing plate disposed adjacent to a second side of the phototool.

Another embodiment, among others, comprises a method for producing relief images comprising receiving non-collimated actinic radiation through a phototool substrate; collimating the actinic radiation in a microstructured surface; and providing the collimated actinic radiation to a photocurable material.

Another embodiment, among others, comprises a method for producing relief images comprising receiving non-collimated actinic radiation; collimating the actinic radiation in a microstructured surface; and providing the collimated actinic radiation to a photocurable material through a phototool substrate.

Another embodiment, among others, comprises a method for producing relief images comprising receiving non-collimated actinic radiation; collimating the actinic radiation in a non-attenuating light collimating article; and providing the collimated actinic radiation to a photocurable material through a phototool substrate.

Other systems, apparatus, structures, combinations, methods, features, and advantages of the present disclosure will be or become apparent to one with skill in the art upon examination of the following drawings and detailed description. It is intended that all such additional systems, apparatus, methods, features, and advantages be included within this description, be within the scope of the present disclosure, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Figure 1:
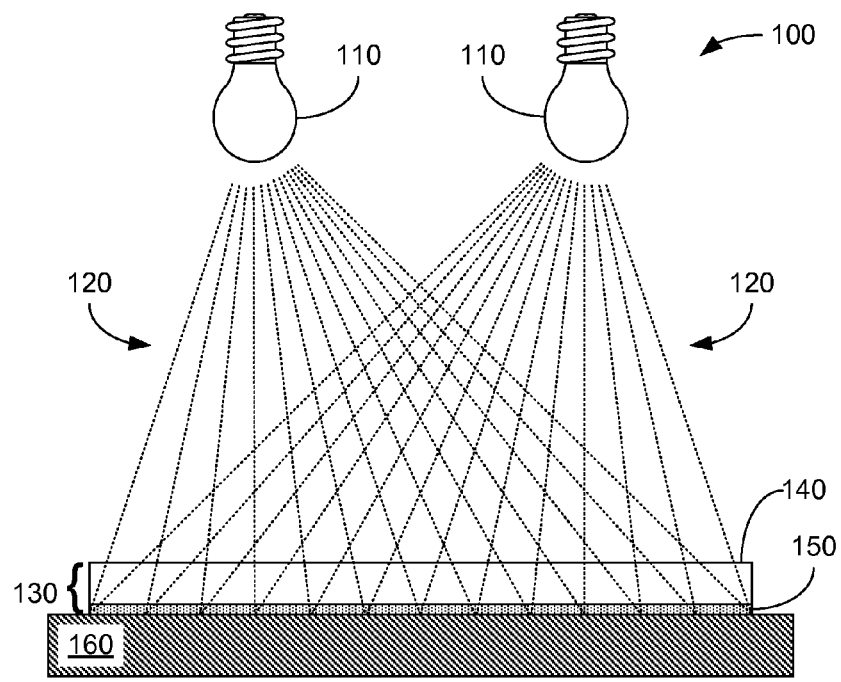
FIG. 1 is a graphical illustration of a relief printing process.

Disclosed herein are various embodiments of structures and methods related to non-attenuating light collimating articles. Reference will now be made in detail to the description of the embodiments as illustrated in the drawings, wherein like reference numbers indicate like parts throughout the several views.

Flexographic printing can utilize printing plates that print on surfaces that are corrugated or smooth such as, but not limited to, packaging materials (e.g., cardboard, plastic films, etc.), containers, or displays. During the process, a layer of liquid or solid material undergoes polymerization, cross-linking, or some other curing reaction upon exposure to actinic radiation. FIG. 1 is a graphical illustration of a relief printing process 100. Multiple sources 110 provide actinic radiation 120, such as, but not limited to, ultraviolet light. The actinic radiation 120 first passes through a phototool 130 including a photographic negative 140, which can be an image-bearing transparency consisting of substantially opaque and substantially transparent areas, and a coating of emulsion 150. Photocuring takes place in the exposed areas of the photocurable material 160, which correspond in position to the substantially transparent areas of the negative 140, to produce raised printing indicia. Little or no photocuring takes place in the unexposed areas of the photocurable material 160.

Photocurable material 160, such as liquid or sheet photopolymers, may also be exposed from the side opposite the phototool 130. This "back exposure" can be used to form a hardened base for the raised printing indicia formed by the frontal exposure. The exposed layer is then developed by removal of the unexposed, unhardened portions using methods such as, but not limited to, an air knife, developer solvent, thermal development (heat and blotting paper), or other means suitable to form a relief image. This method of plate making can result in an image fidelity that is slightly inferior, because the imaging is done through the negative and in a vacuum, which leads to dot gain.

Figure 2:
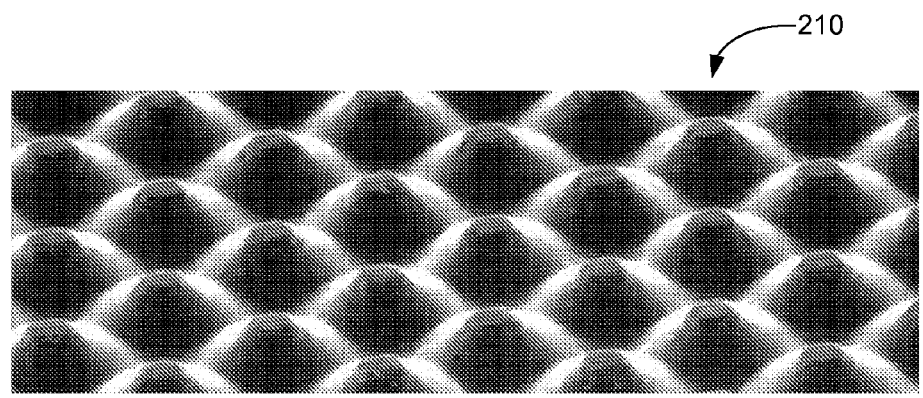
FIG. 2 illustrates highlight dots formed using a conventional phototool, such as in the relief printing process of FIG. 1.

Producing relief images from half-tone negatives 140 can include producing relatively small diameter raised printing indicia in what are otherwise recessed areas of the relief. These areas print the lighter or highlighted areas of the image, and the raised indicia in these areas are accordingly referred to as highlight dots. FIG. 2 illustrates highlight dots 210 formed using a conventional phototool, such as in the relief printing process of FIG. 1. The size and density of highlight dots 210 control shading or tone in the light image areas.

Half-tone relief images may also contain relatively shallow, small diameter depressions in what are otherwise overall raised areas of the relief. These areas print the darker or shadowed areas of the image and the depressions are generally referred to as shadow reverses. The size and density of shadow reverses control the tone in the darker image areas.

Because of the small size of the dots in a half-tone negative 140 used to produce highlight dots 210, a high-image exposure dose can be used to assure both adequate formation of the dots 210 and adequate depth-wise curing. Such curing anchors the dots 210 to the image base.

Shadow reverses typically form beneath relatively small opaque areas of the negative in an otherwise predominantly transparent area. A high exposure dose can result in exposure of at least a portion of the photocurable material 160 underneath the opaque areas of the photonegative 140. This can produce a shadow reverse with sloped sides, which can distort the printed image.

A high image exposure dose can also result in overexposure in areas beyond dot areas of the half-tone negative 140. This can result in increased dot image area, where the resulting relief dot 210 is larger than the corresponding transparent area of the negative 140. In addition, the overexposure may result in a higher, broader shoulder profile on the dot 210. FIG. 2 illustrates the broad shoulder profile of highlight dots 210 formed using a conventional phototool. This can lead to the printing of smudges and larger-than-intended dots resulting in dot gain, particularly where there is any over-impression during printing.

Although a lower radiation dose can be used to both lessen the detrimental effects to shadow reverses and improve dot shoulder geometry, the lower dose often results in unsatisfactory formation and anchoring of the highlight dots 210 because of undercutting. In addition, it has been observed that the highlight dots 210 have a greater tendency to move or deform during the photoexposure step when lower intensity radiation is used. Such dot movement or deformation is believed to be due, at least in part, to shrinkage of the photocurable material 160 as curing occurs. Dot movement can result in positional displacement of the dot 210 and formation of streaks or tails behind the dot 210. These streaks or tails become part of the relief image and adversely affect the quality of images printed with the plate.

Although the foregoing focuses on image fidelity and resolution of half-tone relief images and shadow reverses, it will be appreciated by one skilled in the art that the formation of other types of high resolution relief images such as, but not limited to, line images, include similar considerations.

Figure 3A:
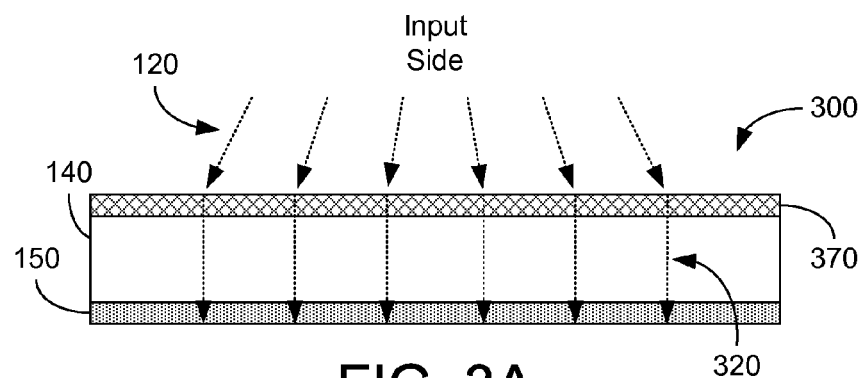
FIGS. 3A and 3B illustrate embodiments of phototools including a microstructured surface of light collimating articles, which can be used in the relief printing process of FIG. 1.
Figure 3B:
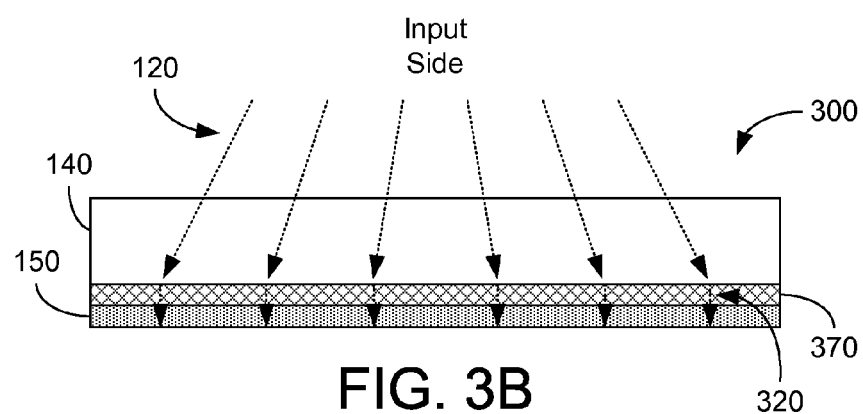

Light collimation without attenuation can improve image fidelity and resolution of relief images by reducing reflection, refraction, diffraction, and shallow angle actinic light. Light collimation can be accomplished using microstructured surfaces comprising light collimating articles. FIGS. 3A and 3B illustrate embodiments of phototools 300 including a microstructured surface 370 of light collimating articles, which can be used in the relief printing process of FIG. 1. The collimating articles can be disposed on a surface of the phototool 300 to induce light collimation of the incident actinic radiation 120 and improve image fidelity.

The light collimating articles of a microstructured surface 370 can be created on a surface including, but not limited to, a thermoplastic surface. The collimating microstructured surface 370 induces actinic light 120 collimation in structures, such as liquid or solid phototools (e.g., negatives, photo mask, and digital mask), which can be disposed adjacent to a printing plate 160. Alternatively, collimating articles can be created on a thermoplastic surface of a printing plate. This would then be a "self-collimating" printing plate including benefits of an external microstructured surface.

In the embodiment illustrated in FIG. 3A, the collimating articles forming the microstructured surface 370 have been disposed on the input side of the phototool 300. Coating either the microstructured surface 370 (e.g., embossed) or the non-structured, smooth surface of the substrate 140 with an emulsion 150 (e.g., silver halide) creates the phototool 300. The emulsion side of the phototool 300 is applied uniformly to the printing plate 160 to minimize variations in the exposure caused by voids or air spaces. A creen may be used on top of this structure and the air evacuated to increase contact between the phototool 300 and the printing plate 160.

The plate 160 is then exposed through the phototool 300 by directing actinic radiation 120 from one or more sources 110 toward the input side (i.e., the side opposite the emulsion 150) of the phototool 300. In FIG. 3A, the actinic radiation 120 is collimated by the microstructured surface 370. Collimated radiation 320 passes through the substrate 140 and the emulsion 150 before encountering printing plate 160.

In another embodiment illustrated in FIG. 3B, the emulsion 150 is applied to the microstructured surface 370. Again, the emulsion side of the phototool 300 is placed on the printing plate. In this embodiment, the plate 160 is exposed through the phototool 300 by directing actinic radiation 120 from one or more sources 110 toward the input side (i.e., the side opposite the emulsion 150) of the phototool 300. The actinic radiation 120 passes through the substrate 140 before being collimated by the microstructured surface 370. Collimated radiation 320 then passes through emulsion 150 before encountering printing plate 160.

Figure 4:
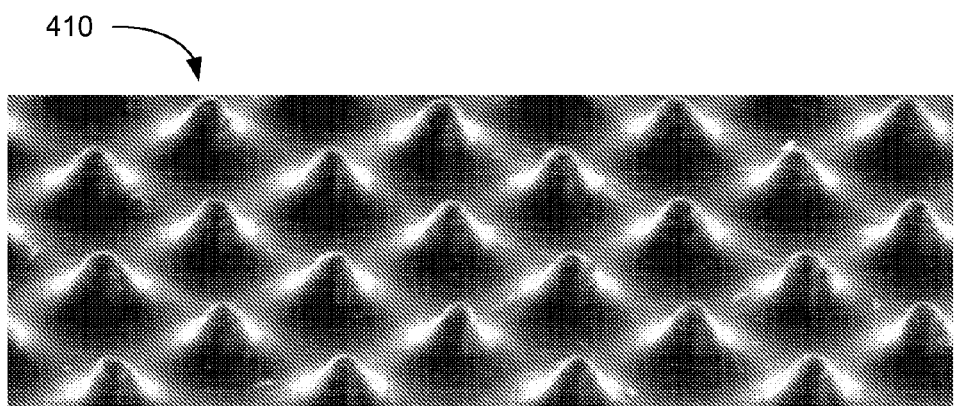
FIG. 4 illustrates the reduced shoulder profile of highlight dots formed using a phototool having a microstructured surface of non-attenuating light collimating articles, such as in the relief printing process of FIG. 1.

Light collimation without attenuation can improve image fidelity and resolution of relief images by reducing reflection, refraction, diffraction, and shallow angle actinic light. FIG. 4 illustrates the reduced shoulder profile of highlight dots 410 formed using a phototool 300 having a microstructured surface of non-attenuating light collimating articles, such as in the relief printing process of FIG. 1. These microstructured phototools can be used in various printing processes, including, but not limited to, conventional flexo printing plates, liquid photopolymer printing plates (and its various forms such as rubber stamps), transfer pad printing plates, conventional lithographic printing plates, screen printing emulsions, letterpress printing plates, and xerographic printing. The structured surface may also offer other benefits such as improved ink transfer.

Transfer pad printing is an indirect gravure process with which almost all materials and shapes can be printed using photopolymer plates. Conventionally exposed Lithographic printing produces a very small relief, in the order of 0.5-5 mils. A light collimating phototool may be used to image the plate to produce the desired image fidelity. In screen printing, where the mask is used to image the emulsion, light collimating phototools can be used to image a negative image on the screen used for the screen printing process. Collimated actinic radiation can improve the fineness of the image that can be imaged on the screen, allowing for smaller and more intricate motifs.

Collimating microstructured surfaces can utilize microreplication of non-attenuating light collimating articles. Microreplication allows formation of repeated structures on small or very small scales. Structural resolution of 2-4 times smaller than the image improves resolution quality. Typical image resolutions in the order of 0.5 mil or approximately 12.5 μm may utilize articles of the order of 3-6 μm for the microstructured surface. The feature sizes of prisms in prismatic systems or facets in the Fresnel systems can be in the range of 0.1 to 12 μm. However, features smaller than that are also possible. Nanostructures in the range of 50-100 nm (0.05 μm to 0.1 μm) can be used to manufacture diffraction gratings and nanometer structures.

Microreplicated surfaces can be produced using many different thermoplastic films including, but not limited to, Acrylic, Polyvinyl Chloride, Polycarbonate, Polystyrene, and Polysulfone. Substrates that are not UV stable and UV transmissive can yellow and become brittle over time and continued exposure to high energy UV radiation. Use of UV transmissive thermoplastics having low absorption in the UV regime mitigates these effects. UV transmissive acrylics that can be used include, but are not limited to, CP-61 Acrylic PMMA and cyclo-olefin polymers having LOW absorption in the UV regime.

Figure 5:
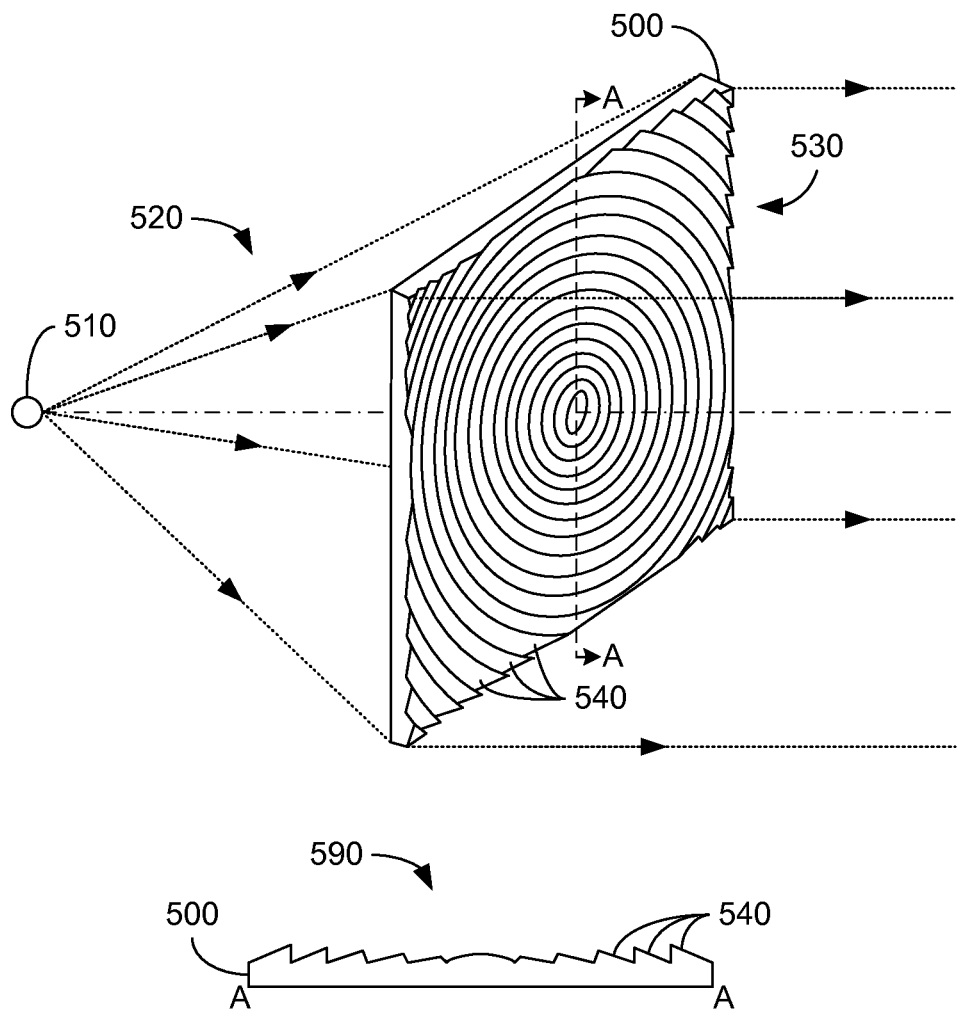
FIG. 5 is an illustration of a positive Fresnel lens, which can be used as a light collimating article included in the phototools of FIGS. 3A and 3B.

The collimating articles that are used can be based on a number of structures including, but not limited to, a Fresnel lens. FIG. 5 is an illustration of a positive Fresnel lens 500, which can be used as a light collimating article included in the phototools 300 of FIGS. 3A and 3B. Fresnel lenses 500 collect light in projection systems to increase the overall display luminance by focusing or collimating light. Light or radiation 520 coming from an illumination system 510 (e.g., bulb, mirror, integrator, or source) diverges as it approaches a display (not shown) or the lens 500. Without collimation of the light 520, the display would have a visible "hotspot" and significantly lower corner luminance. The Fresnel lens 500 collimates the diverging light 520 to produce a directed illumination. A Fresnel lens 500 can similarly collimate actinic radiation 120 from source 110 (FIG. 1).

Unlike traditional lenses, Fresnel lenses 500 do not employ smooth-surface contours to focus rays of light or radiation 520. As illustrated in FIG. 5, the ridged surface 530 of a positive Fresnel lens is molded into many circular, concentric ridges 540. A cross-section 590 of Fresnel lens 500 along centerline A-A illustrates the concentric ridges 540.

Figure 6:
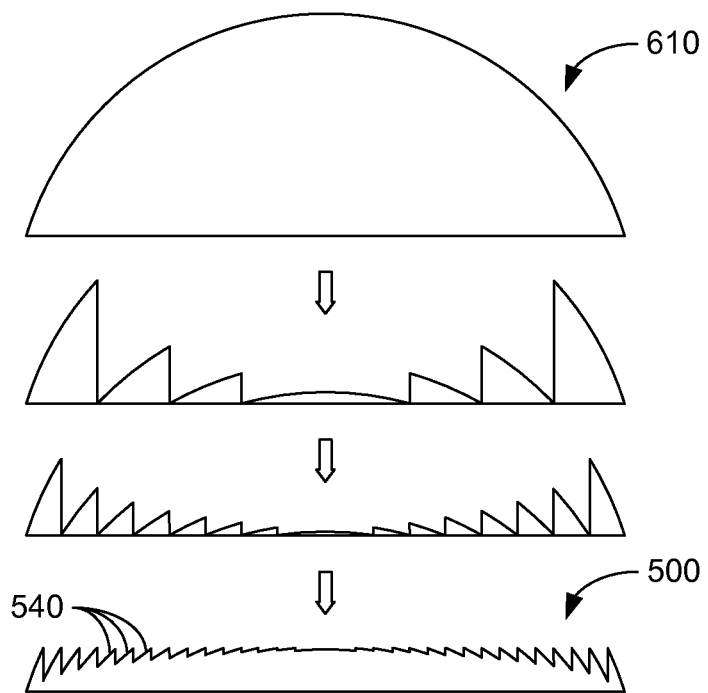
FIG. 6 is a cross-sectional illustration of how a Fresnel lens of FIG. 5 is developed from a conventional lens.
Figure 6:
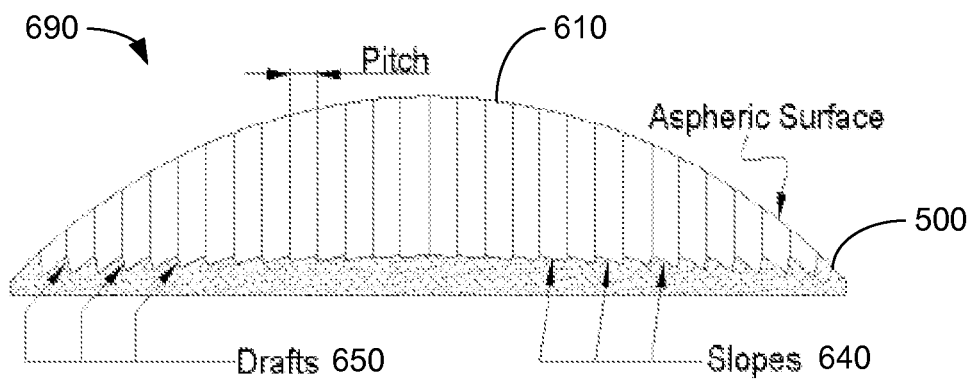

FIG. 6 is a cross-sectional illustration of how a Fresnel lens 500 of FIG. 5 is developed from a conventional lens 610. As shown in FIG. 6, the curve of a lens 610 is reduced to a flat shape by sectioning the lens into concentric ridges 540. Each concentric ridge 540 is formed with a slope 640 to provide focusing or collimation of the light reaching the lens and drafts 650 as transitions between concentric ridges 540. Diagram 690 illustrates the relationship of a conventional lens 610 to a Fresnel lens 500. By choosing appropriate slopes 640 for each concentric ridge 540, designers can define the focal length and control image quality. One skilled in the art would understand that sectioning can use other geometric shapes such as, but not limited to, grids, wedges, rings, and combinations there of to reduce the curve of the lens 610.

In one embodiment, among others, Fresnel lenses are molded from precision optical grade acrylic. Other embodiments may use thermoplastic substrates such as, but not limited to, polyesters and polycarbonates, which may be chosen to minimize yellowing and embrittlement when exposed to the high energy UV actinic radiation. Other types of Fresnel lenses 500 that can be utilized include, but are not limited to, refractive 700, total internal refraction (TIR) 800, and refractive/TIR hybrid 900 as illustrated in FIGS. 7, 8, and 9, respectively.

Figure 7:
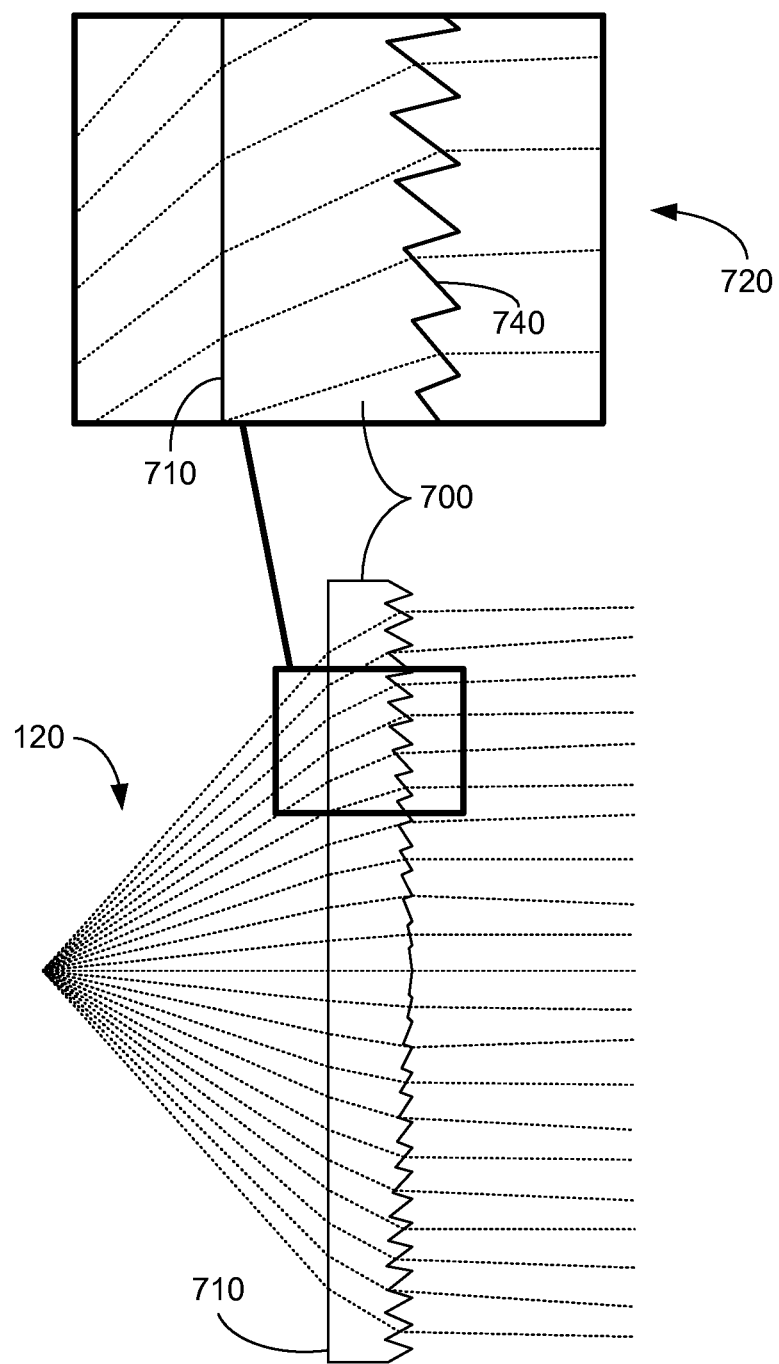
FIG. 7 is a cross-sectional illustration of a refractive Fresnel lens, which can be used as a light collimating article included in the phototools of FIGS. 3A and 3B.

FIG. 7 is a cross-sectional illustration of a refractive Fresnel lens 700, which can be used as a light collimating article included in the phototools 300 of FIGS. 3A and 3B. Actinic radiation 120 supplied by a source 110 (FIG. 1) to a plano interface 710 of the refractive Fresnel lens 700. As illustrated in the enlarged section 720 of lens 700, actinic radiation 120 is refracted at the plano interface 710 and refracted at a slope facet 740 to produce a collimated actinic radiation 320 (FIGS. 3A and 3B).

Figure 8:
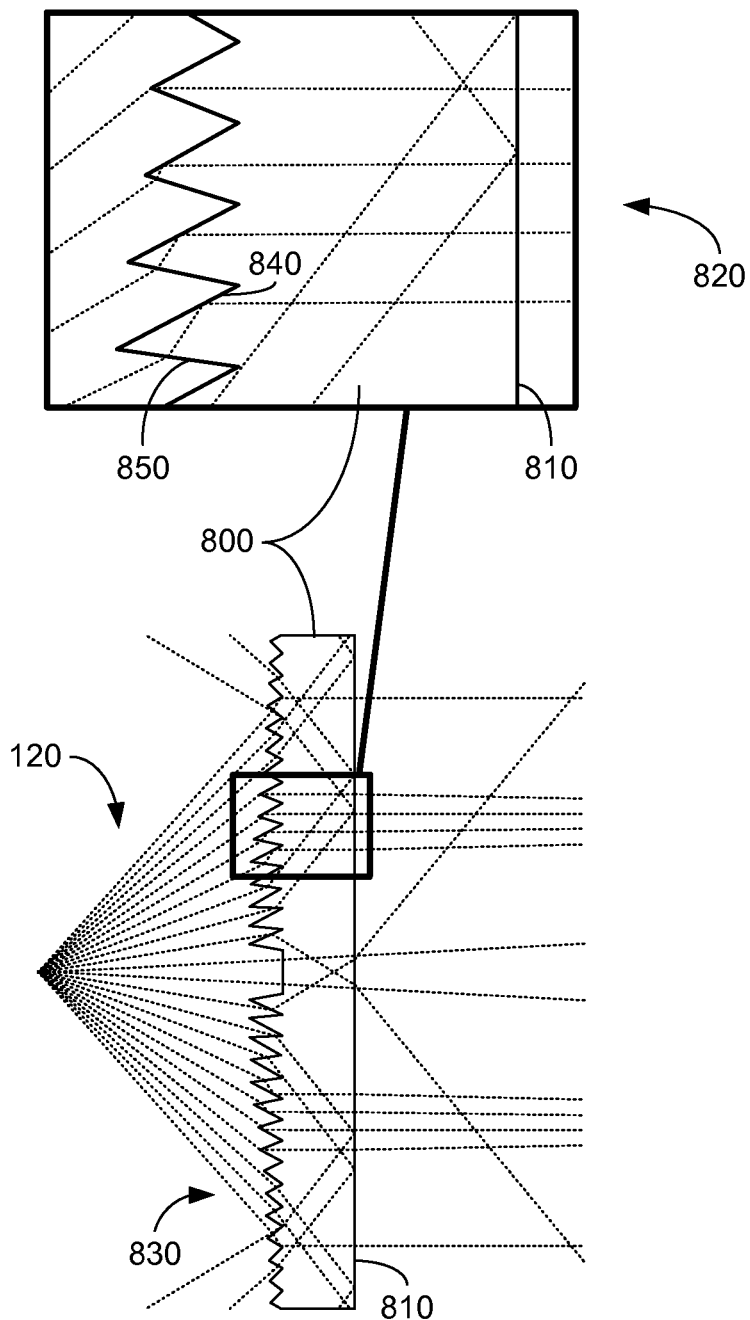
FIG. 8 is a cross-sectional illustration of a total internal refraction (TIR) Fresnel lens, which can be used as a light collimating article included in the phototools of FIGS. 3A and 3B.

FIG. 8 is a cross-sectional illustration of a total internal refraction (TIR) Fresnel lens 800, which can be used as a light collimating article included in the phototools 300 of FIGS. 3A and 3B. Actinic radiation 120 supplied by a source 110 (FIG. 1) to the ridged surface 830 of the TIR Fresnel lens 800. As illustrated in the enlarged section 820 of lens 800, actinic radiation 120 is refracted at a draft facet 850, followed by total internal refraction at a slope facet 840 and refraction at a plano surface 810 to produce a collimated actinic radiation 320 (FIGS. 3A and 3B).

Figure 9:
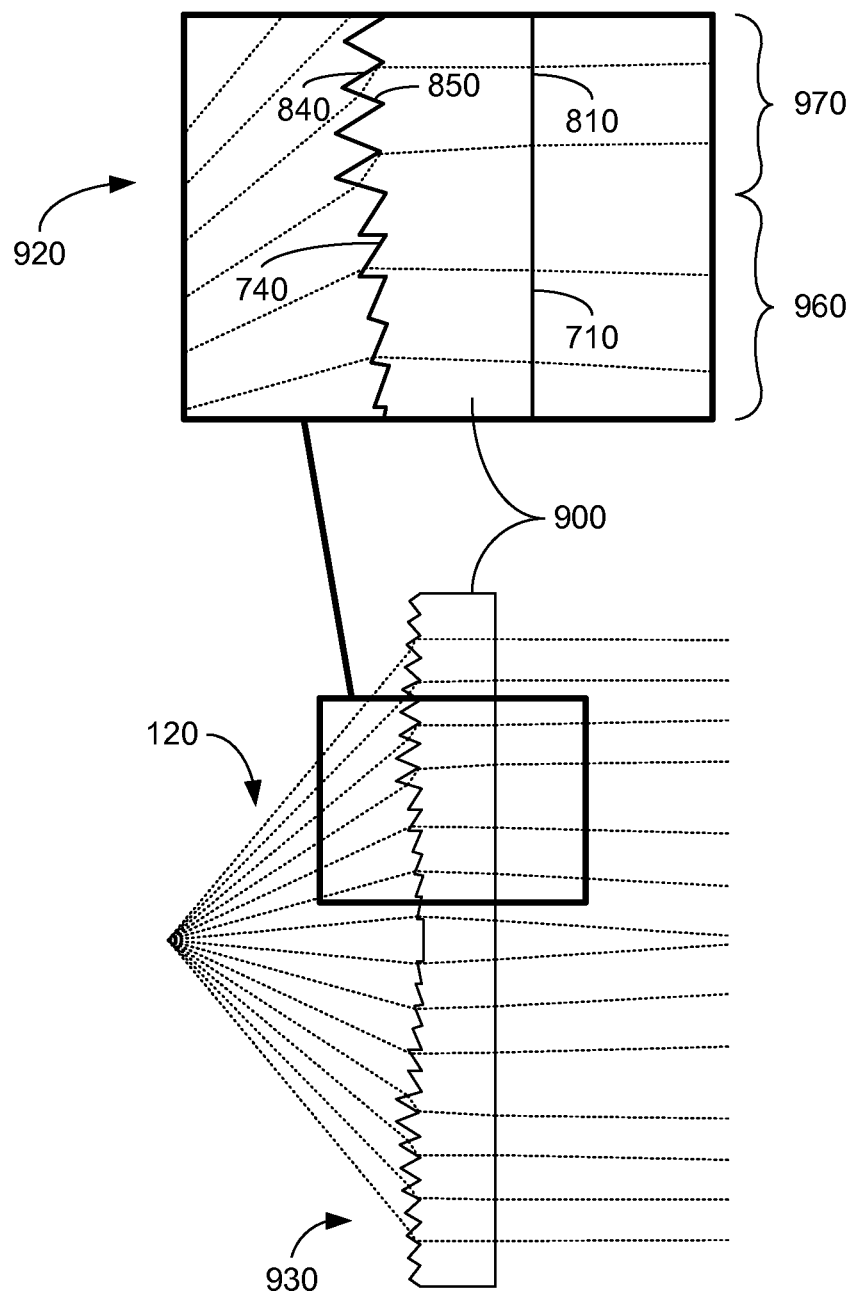
FIG. 9 is a cross-sectional illustration of a refractive/TIR hybrid Fresnel lens, which can be used as a light collimating article included in the phototools of FIGS. 3A and 3B.

FIG. 9 is a cross-sectional illustration of a refractive/TIR hybrid Fresnel lens 900, which can be used as a light collimating article included in the phototools 300 of FIGS. 3A *and* 3B. Actinic radiation 120 supplied by a source 110 (FIG. 1) to the ridged surface 930 of the refractive/TIR hybrid Fresnel lens 900. As illustrated in the enlarged section 820 of lens 800, the hybrid lens 800 comprises a central region 960 including refractive elements and an outer region 970 including TIR elements. In the refractive central region 960, actinic radiation 120 is refracted at a slope facet 740 and refracted at the plano interface 710. In the TIR outer region 970, actinic radiation 120 is refracted at a draft facet 850, followed by total internal refraction at a slope facet 840 and refraction at a plano surface 810. The refractive/TIR combination produces a collimated actinic radiation 320 (FIGS. 3A and 3B).

Collimating microstructured surfaces can include, but are not limited to, microreplication of positive refractive Fresnel lenses 700, total internal refraction (TIR) Fresnel lenses 800, hybrid Fresnel lenses 900 comprising a variety of elements in different regions of the lens (e.g., refractive facets in a central region, TIR design in outer region), or microprism structures. Collimating microstructured surfaces may also comprise a plurality of light collimating articles that form a Fresnel lens. In one embodiment, among others, the geometry of the collimating articles would correspond to facets of a lens. When taken as a group, the light collimating articles would form a complete Fresnel lens. In other embodiments, multiple lenses can be produced by replicating the group of collimating articles. Other embodiments may utilize lens arrays, microlens arrays, linear lens arrays, cylindrical lens arrays, and microreplicated prismatic structures, designed to collimate actinic radiation, as the light collimating articles.

Figure 10A:
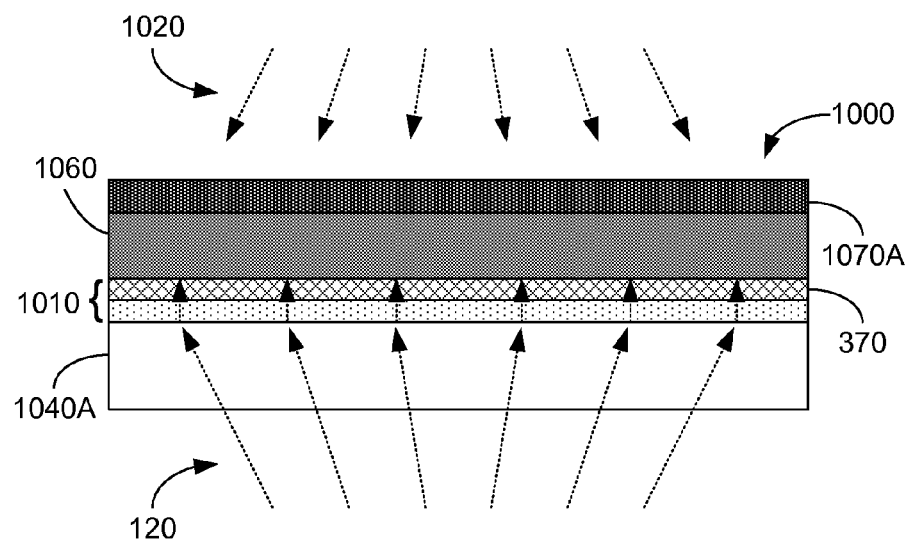
FIG. 10A illustrates an embodiment of a structure including a coversheet with a microstructured surface of light collimating articles, which can be used in the relief printing process of FIG. 1.

Other applications can include, but are not limited to, a coversheet on top of a negative of liquid photopolymers and a creen on a conventional sheet photopolymer. FIG. 10A illustrates an embodiment of a structure 1000 including a coversheet 1010 with a microstructured surface 370 of light collimating articles, which can be used in the relief printing process of FIG. 1. This structure 1000 is also applicable to applications such as, but not limited to, flexography and rubber stamp where the structured surface 370 of the coversheet 1010 is in direct contact with the liquid photopolymers. In the embodiment illustrated in FIG. 10A, the collimating articles forming the microstructured surface 370 have been disposed on a first side of a coversheet 1010. The second side of the coversheet 1010 is disposed adjacent to a phototool substrate 1040A. Intimate contact between the coversheet 1010 and negative 1040A can be produced under vacuum. Liquid photopolymer 1060 is disposed upon the microstructured surface 370 and covered by a PET backing layer 1070A. Actinic radiation 120 is provided to the substrate 1040A where the actinic radiation 120 is transmitted through the transparent areas. Coversheet 1010 collimates the transmitted radiation for curing the liquid photopolymer 1080. "Back exposure" or "flood exposure" 1020 is also applied through the PET backing layer 1070A to form a hardened base or floor for the raised printing indicia that are formed during curing.

Figure 10B:
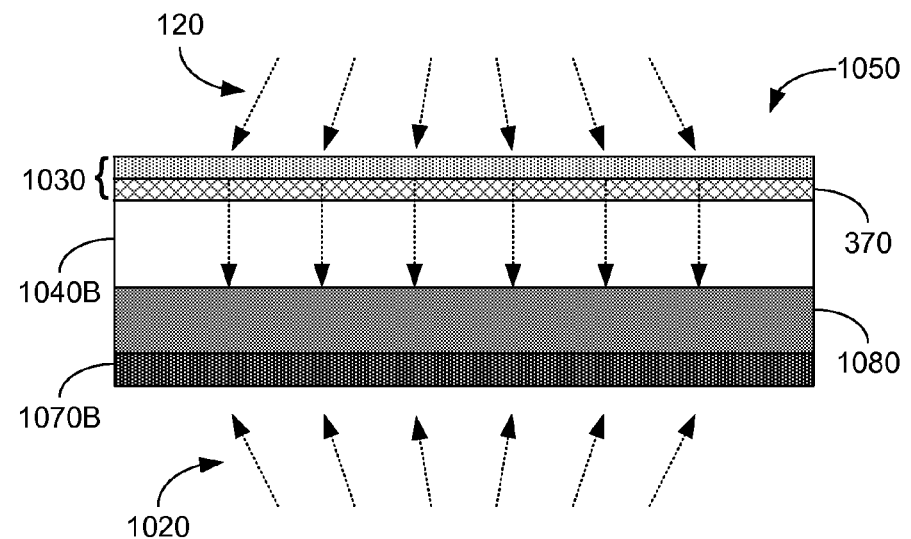
FIG. 10B illustrates an embodiment of a structure including a creen with a microstructured surface of light collimating articles, which can be used in the relief printing process of FIG. 1.

FIG. 10B illustrates an embodiment of a structure 1050 including a creen 1030 with a microstructured surface 370 of light collimating articles, which can be used in the relief printing process of FIG. 1. In the embodiment illustrated in FIG. 10B, the collimating articles forming the microstructured surface 370 have been disposed on a side of a creen 1030. The microstructured surface 370 of the creen 1030 is disposed adjacent to a first surface of a phototool substrate 1040B. A sheet photopolymer 1080 is disposed adjacent to a second surface of a phototool substrate 1040B. A PET backing layer 1070B is disposed on the opposite side of the sheet photopolymer 1080. Actinic radiation 120 is provided through the creen 1030, which collimates the radiation. The collimated actinic radiation is transmitted through the transparent areas of substrate 1040B for curing the sheet photopolymer 1080. "Back exposure" or "flood exposure" 1020 may also be applied through the PET backing layer 1070B to form a hardened base or floor for the raised printing indicia that are formed during curing. Other applications may also include a microstructured surface on a sheet photopolymer, where the uncured thermoplastic photopolymer surface is structured with microprismatic microlenses.

Structures that attenuate actinic radiation energy may also be used as light collimating articles. However, these may require longer exposure times to produce results equivalent to non-attenuating articles.

Figure 11:
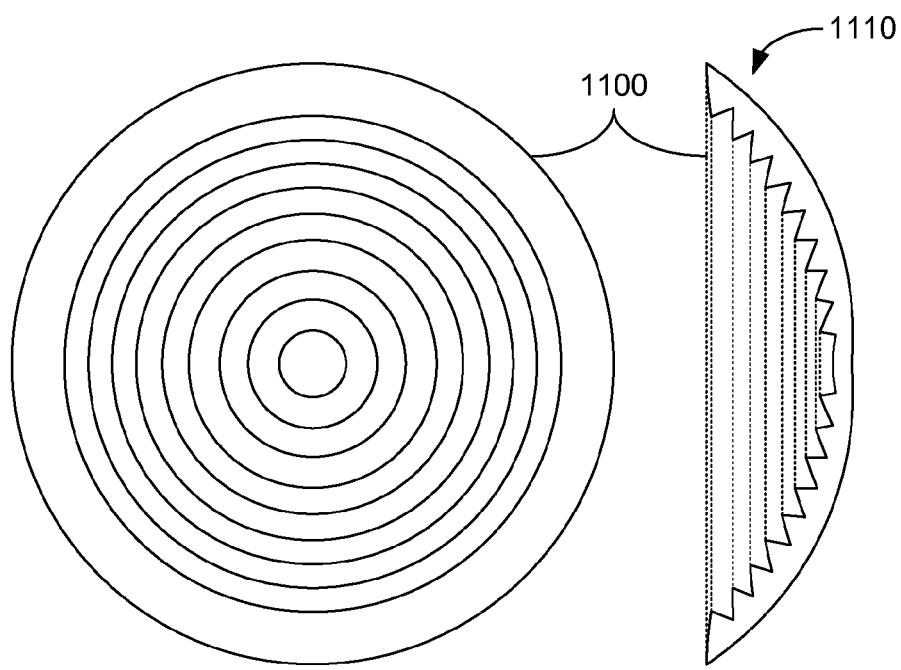
FIG. 11 illustrates a domed Fresnel lens that can be used as a non-attenuating light collimating sleeve for a source of radiation for the relief printing process of FIG. 1.

In other embodiments, the actinic radiation may be collimated at the source before being applied to a phototool. Light collimating articles may be used to provide a non-attenuating collimating sleeve or cover for radiation sources having spectral output in the actinic UV regime (e.g., 200-400 nm). FIG. 11 illustrates a domed Fresnel lens 1100 that can be used as a non-attenuating light collimating sleeve for a source 110 of actinic radiation 120 for the relief printing process of FIG. 1. In this embodiment, a conventional lens 610 (FIG. 6) is reduced to a spherical form using concentric rings. A cross-sectional view 1110 of the sleeve 1100 illustrates the lens structure. One skilled in the art would also understand that a tubular sleeve, based upon a similar cross-section 1110, could be used to collimate light from a tubular source or row of light sources (not shown). In other embodiments, a conventional lens can be reduced to a spherical form using other geometric or grid patterns. One skilled in the art would understand that the focal length could be chosen depending on the application and the process. Such a sleeve 1100 may be utilized to collimate light from sources employed in photocuring in flexography, lithography, screen, pad and letterpress printing processes. Other applications can include In-the-Round (ITR) digitally imaged photopolymer sleeve processes in Flexography and ambient exposed flat Digital flexo plates.

Figure 12:
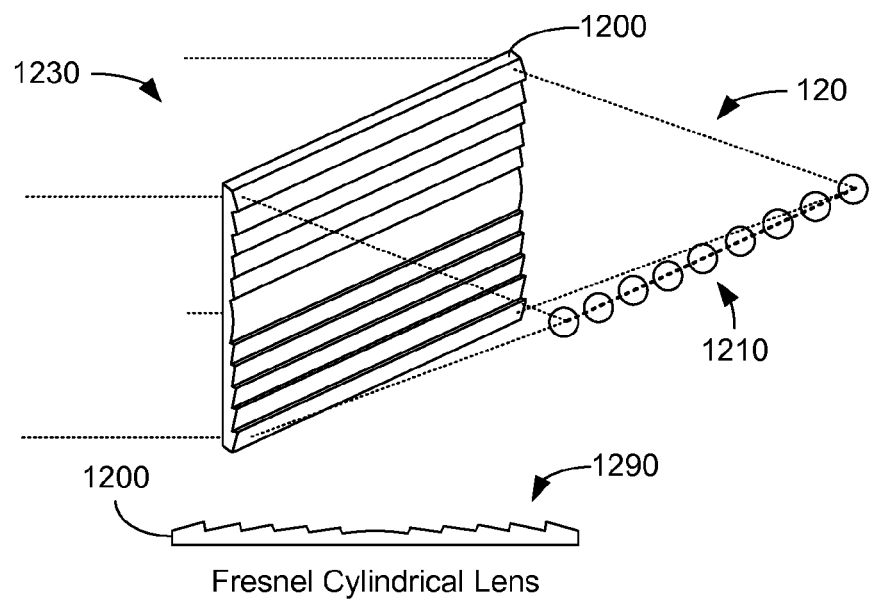
FIG. 12 is an illustration of a Fresnel cylindrical lens that can be used for collimation of a row of sources for the relief printing process of FIG. 1.

FIG. 12 is an illustration of a Fresnel cylindrical lens 1200 that can be used for collimation of a row of sources 1210 for the relief printing process of FIG. 1. As illustrated in FIG. 12, the Fresnel cylindrical lens 1200 receives actinic radiation 120 from a row of sources 1210 such as a bank of lights in graphics applications. As the actinic radiation 120 passes through the non-attenuating lens 1200, collimated actinic radiation 1230 is produced. Similar flat and dome embodiments may also be utilized as light-diffusing screens for large area lighting.

Figure 13:
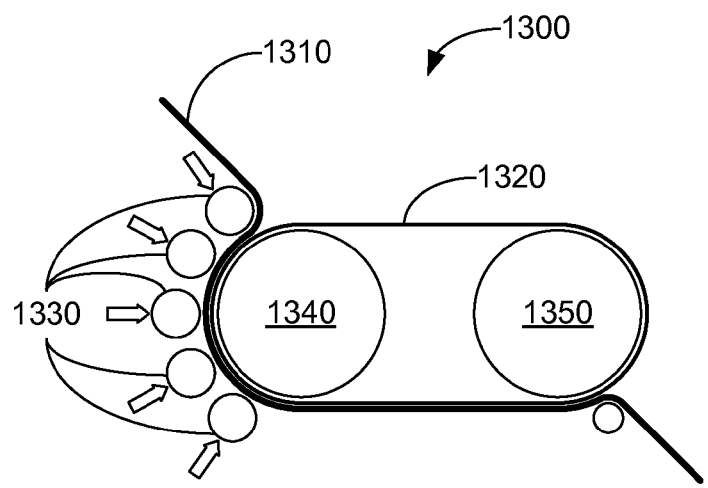
FIG. 13 illustrates one method, among others, to dispose light collimating articles to form a microstructure surface on a phototool of FIGS. 3A and 3B using microembossing.

Various replication processes may be used to form or dispose light collimating articles on a collimating microstructured surface 370. One embodiment, among others, produces microreplicated surfaces 370 by microembossing collimating articles on a substrate using an embossing tool. FIG. 13 illustrates one method, among others, to dispose light collimating articles to form a microstructure surface 370 on a phototool 300 of FIGS. 3A and 3B using microembossing. Microembossing can be accomplished by roll-to-roll embossing of a substrate 1310 using heat and pressure. Substrates 910 can include, but are not limited to, optical grade plastics, polymer films, and polyethylene terephthalate (PET) substrates. Because of the high temperatures that are generated in the UV exposure units, materials that survive high operating temperatures (e.g., in the 120° to 150° C. range) are recommended.

The substrate 1310 is supplied to a roll-to-roll embosser 1300 where it is pressed against an embossing tool 1320. In FIG. 13, the embossing tool 1320 is depicted as a belt formed of metal or other appropriate material. Other embossing tools can include, but are not limited to, sleeves or forms that fit over a roller. Pressure is supplied by rollers 1330, which force the substrate 1310 against the embossing tool 1320. Heat can be applied to the embossing tool 1320 through roller 1340. Roller 1350 can cool the embossing tool 1320 to prevent overheating and distortion of the tool 1320. In this process, the collimating articles are disposed on the substrate by using the substrate material to form the articles.

In other embodiments, a separate layer of material may be introduced between the substrate 1310 and embossing tool 1320. In these embodiments, the collimating articles are disposed on the substrate by using the separate layer of material is form the articles. Applying a UV stable thermoplastic coating prior to embossing may also be utilized. Other embodiments can use an ultraviolet curable liquid photopolymer to create a microstructured coating. In still other embodiments, high precision molding (HPM) may be used to microreplicate the light collimating articles.

Figure 14:
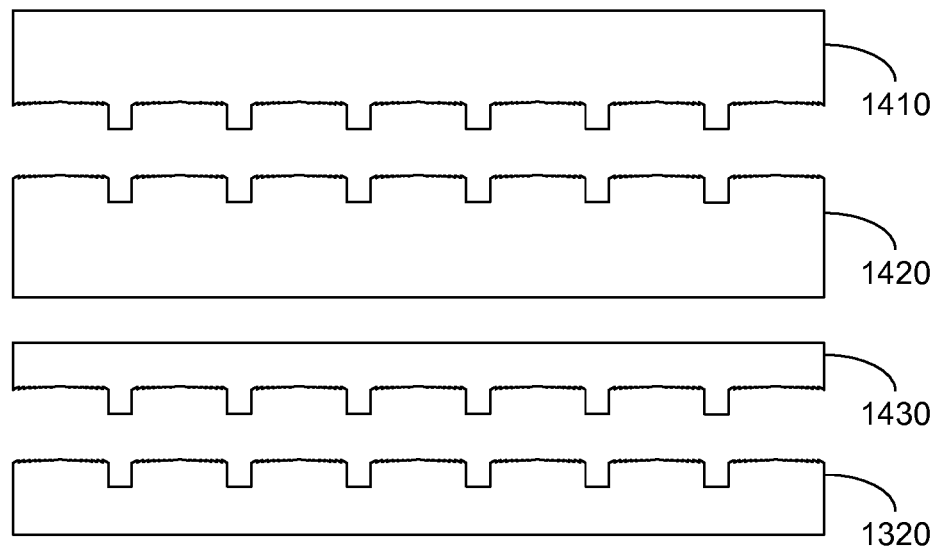
FIG. 14 is an illustration of the tooling process for embossing the light collimating articles of FIG. 13.

FIG. 14 is an illustration of the tooling process for embossing the light collimating articles of FIG. 13. Embossing tools 1320 are manufactured from master tools 1410 and mother tools 1420. Optical designers can use computer modeling to create the master tool 1410. The designers can include, but are not limited to, various Fresnel lens structures, microlens arrays, cylindrical lens arrays, linear lens arrays and prismatic structures in the tool design. One skilled in the art would understand that various aspects such as, but not limited to, type of microstructure, size of the microstructured elements, and arrangements of the arrays are influenced by the optical design of the tooling. For microstructured surfaces 370, master tooling 1410 can be produced using processes including, but not limited to, diamond turning, laser writing, lithography, and e-beam writing.

Mother tools 1420 are produced from the master tool 1410 using electroforming processes or other suitable means. Embossing tools 1320 are then manufactured from a mother tool 1430 as required using electroforming processes or other suitable means. The embossing tool 1320 can then be used to dispose collimating articles on a substrate 1310 (e.g., polymer film) as discussed in relation to FIG. 13.

Other processes may be used to replicate light collimating articles (e.g., Fresnel lenses). These include, but are not limited to: compression molding; injection molding; high precision molding (HPM); injection compression molding (also know as coining); cell casting; continuous casting; discrete embossing; and continuous embossing.

In choosing the appropriate manufacturing process for a particular collimating article, such as a Fresnel lens, considerations include: fidelity (feature sharpness and aspect ratios possible); tooling cost; per unit cost; process cycle times; and control of internal stress/birefringence. To complicate matters, these considerations can be interrelated. For example, a compression molded article may have sharper features and much lower internal stress. The penalty, however, is cycle time and per unit cost. In contrast, HPM combines the attractive features of both processes. TABLE 1 provides a comparison of various replication processes that may be used.

TABLE 1

|  | Compression Molding | Injection Molding | HPM | Coining | Casting | Embossing |
| --- | --- | --- | --- | --- | --- | --- |
| Precision | Very High | Low | High | Medium/High | High | High |
| High Aspect Ratio | Easiest | Difficult | Easy | Difficult | Moderate | Moderate |
| Replication Fidelity | Very High | Low | High | Low/High | Very High | High |
| Tooling Cost | Low | High | Medium | High | High | Medium |
| Unit Cost | High | Low | Medium | Medium/Low | High/Low | High/Medium |
| Internal Stress | Very Low | High | Low | Medium/Low | Medium | Low |

It should be emphasized that the above-described embodiments of the present invention are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

At least the following is claimed:

1. A combination for producing relief images, comprising:
a source of actinic radiation;
a phototool system positioned to receive actinic radiation from the source at a first side of the phototool system, the phototool system comprising a microstructured surface, the microstructured surface comprising a plurality of Fresnel lenses; and
a printing plate disposed adjacent to a second side of the phototool system.

2. A combination for producing relief images, comprising:
a source of actinic radiation;

a phototool system positioned to receive actinic radiation from the source at a first side of the phototool system, where the phototool system comprises an integrated single-layer phototool system including a photographic negative and a microstructured surface, the microstructured surface comprising a plurality of light collimating articles; and a printing plate disposed adjacent to a second side of the phototool system.

3. The combination of claim 2, wherein the microstructured surface is disposed on the first side of the integrated single-layer phototool system.

4. The combination of claim 3, wherein the integrated single-layer phototool system comprises an imaged negative emulsion on the second side of the phototool system.

5. The combination of claim 4, wherein the printing plate is disposed adjacent to the imaged negative emulsion.

6. The combination of claim 2, wherein the printing plate is a sheet photopolymer flexographic printing plate or a transfer pad printing plate.

7. A combination for producing relief images, comprising:
a source of actinic radiation;
a phototool system positioned to receive actinic radiation from the source at a first side of the phototool system, the phototool system comprising a microstructured surface, the microstructured surface comprising a plurality of light collimating articles that comprise an array of a plurality of prismatic light deflecting microlenses or an array of cylindrical microlenses; and
a printing plate disposed adjacent to a second side of the phototool system.

8. The combination of claim 7, wherein the printing plate is a sheet photopolymer flexographic printing plate.

9. The combination of claim 7, wherein the printing plate is a transfer pad printing plate.

10. The combination of claim 7, wherein the plurality of light collimating articles are non-attenuating.

11. The combination of claim 7, wherein the phototool system is a non-integrated bi-layer phototool system comprising a photographic negative and a separate light collimating layer that includes the microstructured surface disposed on a first surface facing the source of actinic radiation.

12. The combination of claim 11, wherein the non-integrated bi-layer phototool system comprises an imaged negative emulsion on a surface of the photographic negative that is facing away from the source of actinic radiation.

13. The combination of claim 7, wherein the phototool system is a non-integrated bi-layer phototool system comprising a photographic negative and a separate light collimating layer that includes the microstructured surface disposed on a surface facing away from the source of actinic radiation.

14. The combination of claim 13, wherein the non-integrated bi-layer phototool system comprises an imaged negative emulsion on a surface of the photographic negative that is facing away from the source of actinic radiation.

15. A combination for producing relief images, comprising:
a source of actinic radiation;
a phototool system positioned to receive actinic radiation from the source at a first side of the phototool system, the phototool system comprising a microstructured surface, the microstructured surface comprising a plurality of light collimating articles that comprise an array of a plurality of prismatic light deflecting microlenses or an array of cylindrical microlenses;
a coversheet disposed adjacent to a second side of the phototool system; and
a liquid photopolymer disposed adjacent to the coversheet.

16. The combination of claim 15, wherein the phototool system is a non-integrated bi-layer phototool system comprising a photographic negative and a separate light collimating layer that includes the microstructured surface disposed on a surface facing the source of actinic radiation.

17. The combination of claim 15, wherein the phototool system is a non-integrated bi-layer phototool system comprising a photographic negative and a separate light collimating layer that includes the microstructured surface disposed on a surface facing away from the source of actinic radiation.

18. The combination of claim 15, further comprising an imaged negative emulsion on the second side of the phototool system.

19. A combination for producing relief images, comprising:
a source of actinic radiation;
a phototool system positioned to receive actinic radiation from the source at a first side of the phototool system, where the phototool system comprises an integrated single-layer phototool system including a photographic negative and a microstructured surface, the microstructured surface comprising a plurality of light collimating articles;
a coversheet disposed adjacent to a second side of the phototool system; and
a liquid photopolymer disposed adjacent to the coversheet.

20. The combination of claim 19, wherein the microstructured surface is disposed on the first side of the single-layer phototool system facing the source of actinic radiation.

21. The combination of claim 20, wherein the integrated single-layer phototool system comprises an imaged negative emulsion on the second side of the phototool system.

* * * * *